United States Patent [19]

Moore

[11] Patent Number: 5,053,247

[45] Date of Patent: Oct. 1, 1991

[54] METHOD FOR INCREASING THE BATCH SIZE OF A BARREL EPITAXIAL REACTOR AND REACTOR PRODUCED THEREBY

[75] Inventor: Gary M. Moore, San Jose, Calif.

[73] Assignee: Moore Epitaxial, Inc., San Jose, Calif.

[21] Appl. No.: 317,260

[22] Filed: Feb. 28, 1989

[51] Int. Cl.[5] .............................................. C23C 16/46
[52] U.S. Cl. ................................. 427/55; 427/248.1; 427/255.5; 118/724; 118/725; 118/728; 118/730; 156/610; 219/390; 219/405; 219/411; 392/411
[58] Field of Search ............... 118/715, 724, 725, 730, 118/728; 156/610; 427/55, 248.1, 255.5; 219/343, 354, 405, 411, 390; 392/411, 416, 418

[56] References Cited

U.S. PATENT DOCUMENTS

| | | | |
|---|---|---|---|
| 3,623,712 | 11/1971 | McNeilly et al. | 118/725 |
| 3,862,397 | 1/1975 | Anderson et al. | 156/610 |
| 4,047,496 | 9/1977 | McNeilly et al. | 118/725 |
| 4,081,313 | 3/1978 | McNeilly et al. | 156/610 |
| 4,099,041 | 7/1978 | Berkman et al. | 118/728 |
| 4,322,592 | 3/1982 | Martin | 118/730 |
| 4,496,828 | 1/1985 | Kusmierz et al. | 219/405 |
| 4,511,788 | 4/1985 | Arai et al. | 219/405 |
| 4,728,389 | 3/1988 | Logar | 156/613 |
| 4,789,771 | 12/1988 | Robinson et al. | 118/730 |

FOREIGN PATENT DOCUMENTS 61-210622  9/1986  Japan .................................. 118/725

OTHER PUBLICATIONS

"Precision 7700 Epi System Specifications", Applied Materials, 1989.
AMC 7810 and 7820 Radiantly Heated Epitaxial Reactor Systems, p. 11, Applied Materials, Inc.

Primary Examiner—Shrive P. Beck
Assistant Examiner—Terry J. Owens
Attorney, Agent, or Firm—Skjerven, Morrill, MacPherson, Franklin & Friel

[57] ABSTRACT

The batch capacity of a barrel epitaxial reactor is improved by increasing the reaction chamber size and increasing the length of the radiant heat source so that a uniform temperature is maintained over a larger flat zone in the reaction chamber. Also, forced air flow from the blower of the reactor is distributed so that a positive air flow is maintained along the exterior wall of the reaction chamber and consequently the wall is maintained at a uniform cold temperature relative to the temperature of the reaction chamber.

23 Claims, 9 Drawing Sheets

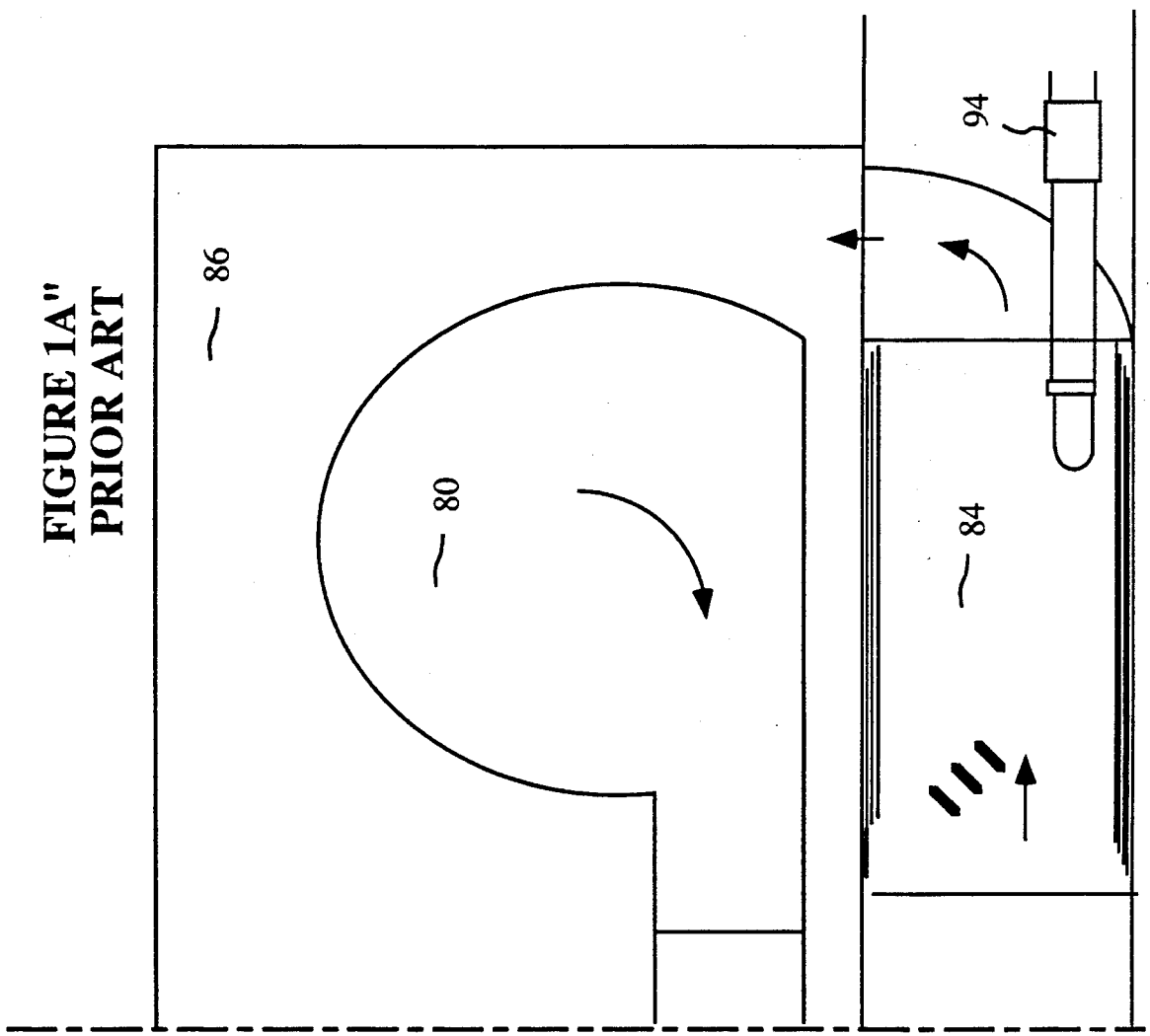

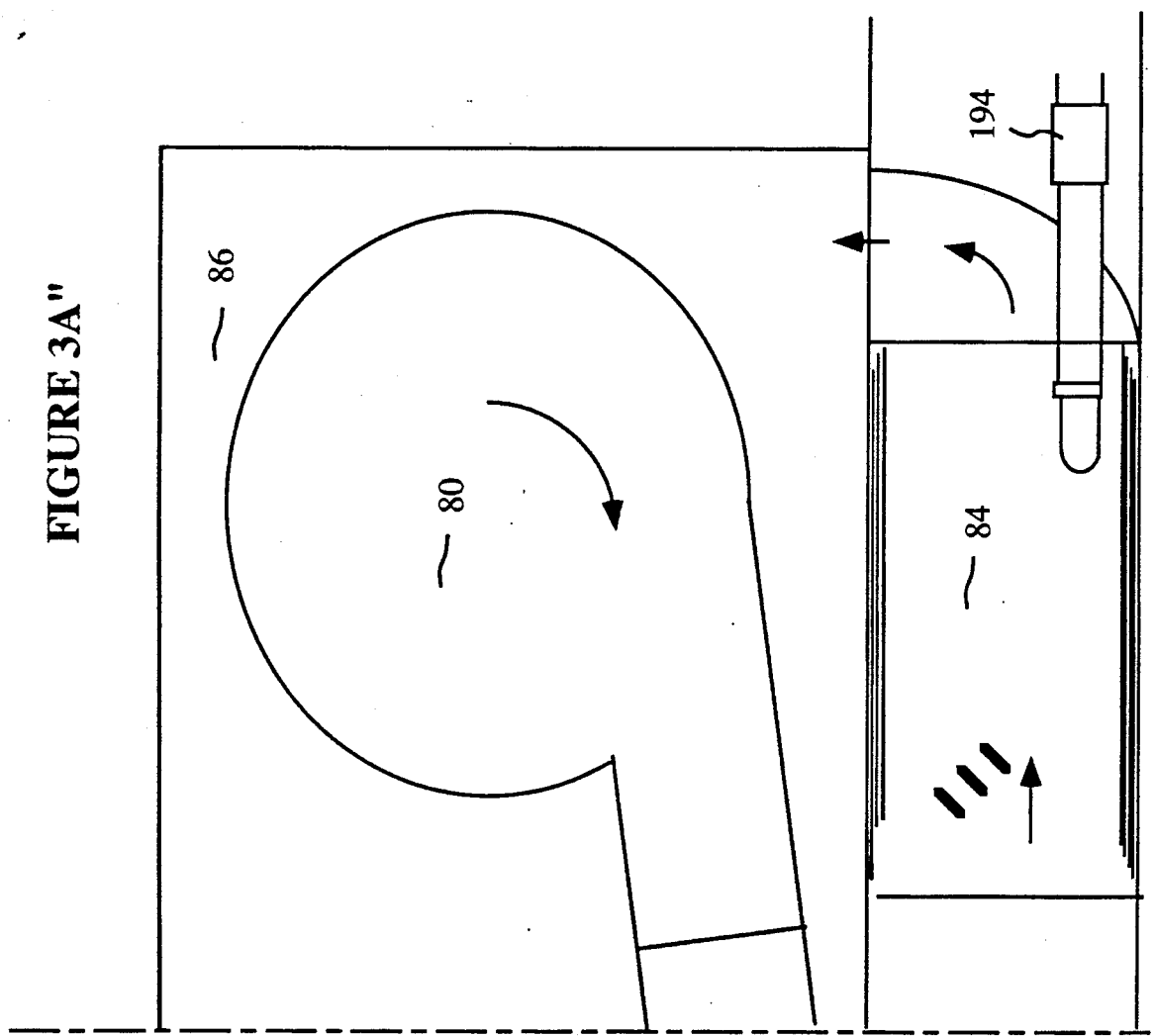

METHOD FOR INCREASING THE BATCH SIZE OF A BARREL EPITAXIAL REACTOR AND REACTOR PRODUCED THEREBY

BACKGROUND OF THE INVENTION

1. Field of the Invention

This invention relates generally to epitaxial reactors for producing uniform film coatings on selected surfaces and more particularly to a barrel epitaxial reactor, which has a greater batch capacity than prior art barrel epitaxial reactors and which produces an epitaxial layer quality at least as good as that produced by the prior art barrel epitaxial reactors.

2. Description of the Prior Art

Several alternative types of radiant heating epitaxial reactors are known in the prior art. See, for an example of one type of epitaxial reactor, U.S. Pat. No. 4,081,313 issued on Mar. 28, 1978 to McNeilly et al. Generally, each epitaxial reactor has (i) a reaction chamber, (ii) a heat source and temperature control, and (iii) gas sources and a gas flow controller.

A side cross sectional view of one prior art barrel epitaxial reactor is shown in FIG. 1A. Reactor 10 is available from Applied Materials of Santa Clara, Calif. Reactor 10 is supplied by Applied Materials under Model Nos. 7600, 7800, 7810 and 7820.

Reaction chamber 60 of reactor 10 is the interior volume of bell jar 40 between transition region 46 and edge 45A of bead-blasted region 45. Heat source 50 consists of five banks of quartz halogen lamps 51. Each bank of lamps 51 consists of a column of fourteen lamps 51, as described more completely below. Gas ring 20 is connected to the gas sources and a gas controller. Heat source 50 and reactor chamber 60 are contained within housing 15. Housing 15 of reactor 10 bounds a volume which is about 36 inches high and about 46 inches wide.

The five banks of lamps 51 in heat source 50 form a pentagon about bell jar 40, as illustrated in FIG. 1B, with each bank occupying one side of the pentagon. In FIG. 1B, only the relative positions of the five banks of heat source 50 and bell jar 40 are represented for clarity. (The figures are not drawn to scale and are intended to only show the relative positions of components within reactor 10.) Lamps 51 produce radiant energy in the short wavelength range, i.e., approximately one micron or below. Each lamp 51 is mounted in a one and one-eighth inch parabolic gold plated highly polished reflector 52. (In the Figures, subscripts on reference numerals are used to (i) represent similar components and (ii) to denote particular features of a component. In the description, a reference numeral without a subscript is used as a shorthand notation to refer to all occurrences of that reference numeral with subscripts in the drawings).

The short wavelength radiant energy from heat source 50 is transmitted through transparent quartz wall 41 of bell jar 40. Quartz wall 41 absorbs little or no radiation. Radiant energy from heat source 50 is incident on a susceptor 65 mounted within reaction chamber 60. Susceptor 65 is suspended in bell jar 40 by a quartz hanger 61 which in turn is rotatably connected through opaque quartz top flange 47 to a rotation means (not shown) so that susceptor 65 and wafers 70 mounted thereon can be rotated relative to heat source 50. The rotation of susceptor 65 ensures uniform heating of susceptor 65 and wafers 70.

Susceptor 65 is made from a material that absorbs the radiant energy from heat source 50 and provides a uniform temperature surface for wafers 70. Susceptor 65 is usually made of graphite and coated with a thin coating of silicon carbide over the outer surface. The silicon carbide coating prevents contamination of wafers 70 with carbon.

The size of susceptor 65 limits the capacity of reactor 10 because the size determines the number of wafers, i.e., the batch capacity, which can be placed in reaction chamber 60 at one time. The "batch capacity" is sometimes referred to as the "batch size". Table 1 lists the batch capacity of barrel epitaxial reactor 10.

TABLE 1

| Batch Processing Capacity of Barrel Epitaxial Reactor 10 | |
|---|---|
| Wafer Diameter (mm) | Batch Size |
| 100 | 24 |
| 125 | 12 |
| 150 | 10 |
| 200 | 4 |

Susceptor 65 has a length of approximately 16.75 inches and provides a flat zone of approximately 12 inches. As used herein, the length of susceptor 65 refers to the vertical dimension of susceptor 65. The vertical dimension of susceptor 65 or of any other component in reactor 10 is the dimension in the same direction as the direction extending from the gas entrance of reaction chamber 60 (the top of reaction chamber 60) to the gas exit of reactor chamber 60 (the bottom of reaction chamber 60).

The "flat zone" of susceptor 65 is the region on each face of the exterior surface of susceptor 65 where wafers may be placed and uniform epitaxial depositions achieved on the wafers. Flat zone 67 of susceptor 65 is illustrated in FIG. 1 by the dashed line which encloses wafers 70.

For reactor 10 (FIG. 1A), flat zone 67 is defined so that the variation in thickness of the epitaxial layers from wafer to wafer on adjacent wafers is at most ±5% and the variation in resistivity of the epitaxial layers from wafer to wafer on adjacent wafers is at most ±8-10%. Across flat zone 67, the thickness variation of the epitaxial layers from wafer to wafer on any two non-adjacent wafers, including wafers at opposite ends of the flat zone, is at most ±4-7% and the resistivity variation from wafer to wafer on any two non-adjacent wafers is at most ±4-12%. These variations are the industry standards for growth of epitaxial layers.

Quartz bell jar 40, in which susceptor 65 is mounted, has a lower flange 42 which is connected to a lower support 43 for bell jar 40. O-ring 24 provides a seal between lower flange 42 and exhaust cup 30. Lower support 43, about 3 inches in length, is connected to side wall 41 by lower curved portion 44 of jar 40. Lower curved portion 44 has been bead-blasted (i.e., subjected to a high velocity stream of beads, typically of 180 grit glass beads) to produce an opaque surface region 45. Edge 45A is the end of bead-blasted lower curved portion 44. As previously described, edge 45A defines the bottom of reaction chamber 60. Transparent vertical sidewall 41 of quartz bell jar 40 terminates in a transition region 46 to which opaque quartz top flange 47, typically made of white quartz, is connected. Transition region 46 is about three inches in length.

The spatial relationship between side wall 41, curved portion 44, lower support 43 and transition region 46 affects the gas flow dynamics, e.g., the gas velocity, the gas mass flux, the flow mixing, and the flow turbulence within reaction chamber 60. If the spatial relationship of these portions of bell jar 40 is modified the gas flow dynamics within reaction chamber 60 are altered. Since the uniform growth of the epitaxial layers in reaction chamber 60 is directly dependent upon the gas flow dynamics, any modification to bell jar 40 affects the uniformity of the epitaxial layers grown.

Opaque top flange 47 rests on a base plate 32 and is sealed by an O-ring 21 between base plate 32 and top flange 47. Top flange 47 is secured by a gas ring 20 and two O-rings 22, 23. The reactant gases are introduced into reaction chamber 60 through gas ring 20. After the gases pass through reaction chamber 60, the gases are exhausted through an opening or openings in lower flange 42 into stainless steel exhaust cup 30. Exhaust cup 30 is attached to support assembly 31 which positions bell jar 40 within epitaxial reactor 10.

The gas flow through reaction chamber 60 depends upon the desired epitaxial growth rate and the process specifications. In reactor 10, the epitaxial growth is a function of the hydrogen flow and the flow of the other reactant gases through chamber 60. The gas flow into reaction chamber 60 is controlled using jet settings that are adjusted to separate points on a grid and control of hydrogen main flow and hydrogen rotation flow. The control of jet settings and hydrogen flow is known by one skilled in the art. For reactor 10, typical jet settings on the grid for uniform epitaxial layer growth are 3.5 and 3.5 and a typical hydrogen flow setting for uniform epitaxial layer growth is a main flow of 120 liters per minute (l/m) and a rotation flow of 100 l/m.

Epitaxial growth on wafers 70 within reactor 10 requires temperatures within the range of about 900° to 1200° C. However, quartz wall 41 is typically maintained at about 600° C., so that relative to the 900°-1200° C. temperatures in reaction chamber 60, wall 41 is cold. Cold wall 41 of bell jar 40 limits growth of films on the interior surface of wall 41. As used herein, the "interior" surface and "exterior" surface of a bell jar are relative to reaction chamber 60, so that the "interior" surface is a boundary of reaction chamber 60 and the "exterior" surface is outside of reaction chamber 60.

Wall 41 must be maintained at a constant temperature, because if the temperature of wall 41 increases, films are deposited on wall 41. These films absorb radiant energy which in turn affects the uniformity of epitaxial layers grown in reactor 10.

To maintain wall 41 of bell jar 40 at the desired temperature and to protect the other components in reactor 10 from high temperatures, heat source 50 and the exterior surface of jar 40, i.e., transition region 46, wall 41 and curved portion 44 are cooled by forced air circulation. Specifically, a blower 80 provides a constant airflow to a supply plenum 81. Supply plenum 81 has a vertical riser 85 which is connected to water cooled heat exchanger 53 on the back of lamp assemblies 50. Thus, air from blower 80 enters supply plenum 81 and is passed through heat exchanger 53 on the back of lamp assemblies 50 through reflector 52 and around lamps 51 into region 62 between bell jar wall 41 and lamp assemblies 50.

Since there is a resistance to airflow from vertical riser 85 into region 62, some of the airflow from blower 80 is diverted from supply plenum 81 through two inch outer diameter pipe 82 into upper plenum region 63.

The forced air flow from pipe 82 through upper plenum region 63 prevents hot stagnant air from accumulating in plenum region 63.

Forced air flow from region 63 and from vertical riser 85 flows down sidewall 41 of bell jar 40 into exhaust plenum 83, which is located at the bottom of reactor 10. The air passes through exhaust plenum 83 into a heat exchanger 84. Heat exchanger 84 is water cooled with a flow of about 5 gallons per minute. The cooling water flow is regulated by flow restrictor 94. Thus, the air is cooled as it flows through heat exchanger 84 and the cooled air from heat exchanger 84 flows into blower supply plenum 86.

In addition to the air cooling, upper plenum region 63 has a water cooled cooling plate 88 which has a gold plated surface adjacent to lamp assemblies 50. Similarly, supply plenum 81 is cooled by water cooled wall 89 which has a gold plated surface facing bell jar 40 that reflects radiant heat energy away from supply plenum 81. In addition, a gold plated protective collar 87 is mounted about lower flange 42 of bell jar 40. The gold plating on these components reflects radiant energy away from other components exterior to reaction chamber 60, and hence limits both heating losses from reaction chamber 60 and heating of components exterior to reaction chamber 60.

The forced air cooling of reactor 10 maintains a uniform wall temperature for the configuration of bell jar 40, heat source 50, supply, exhaust and upper plenums 81, 82, 63 shown in FIG. 1A. If the configuration of these components is changed, the forced air cooling of wall 41 and consequently the wall temperature is affected because the air flow over wall 41 would be changed. Such a change in wall temperature modifies the temperature profile in the reaction chamber 60 which in turn can affect the gas distribution within reaction chamber 60. The cumulative effect of such changes on the uniform growth of epitaxial layers is unknown.

Each of the five banks of heat source 50 has fourteen lamps 51 (FIG. 2A). The radiant energy from each lamp 51 is directly proportional to the voltage across the lamp. Therefore, as illustrated in Table 2, a higher voltage is applied to lamps $51_1$–$51_3$ and $51_{12}$–$51_{14}$ on the upper and lower periphery respectively of reactor chamber 60. Outermost lamps $51_1$, $51_{14}$ (FIG. 2A) of each bank have an applied voltage of 350 volts, while the next two lamps $51_2$, $51_3$ and $51_{12}$, $51_{13}$ each have an applied voltage of 300 volts The remaining eight lamps $51_4$–$51_{11}$ each have an applied voltage of 240 volts.

TABLE 2

| Voltage Distribution for Each Bank of Heat Source 50 | | | |
|---|---|---|---|
| Lamp No | Voltage | Lamp No. | Voltage |
| $51_1$ | 350 | $51_8$ | 240 |
| $51_2$ | 300 | $51_9$ | 240 |
| $51_3$ | 300 | $51_{10}$ | 240 |
| $51_4$ | 240 | $51_{11}$ | 240 |
| $51_5$ | 240 | $51_{12}$ | 300 |
| $51_6$ | 240 | $51_{13}$ | 300 |
| $51_7$ | 240 | $51_{14}$ | 350 |

The higher voltages are required for six outermost lamps $51_1$–$51_3$, $51_{12}$–$51_{14}$ in each bank to compensate for the boundary conditions, i.e., the energy absorbing structure at the top and bottom of reactor 10, and heat losses from susceptor 65 and reaction chamber 60.

Lamps 51 in each bank are separated into three groups: a first group consisting of lamps $51_1$–$51_5$; a second group consisting of lamps $51_6$–$51_9$; and a third group consisting of lamps $51_{10}$–$51_{14}$. Each group of lamps 51 is connected to a silicon controlled rectifier (SCR). The load on the SCR for the second group is only about 70% of the load on the other two SCRs. Since each lamp bank has fourteen lamps, two fourteen pin connectors are used to connect power to each bank of lamps.

An infrared sensor (not shown) is lowered through a sheath in quartz hanger 61 into susceptor 65 and is positionable at locations 64 in susceptor 65. Each of the three locations permits measurement of the radiant energy from one of the three groups of lamps as defined above. The infrared sensor is connected through a closed loop temperature control system to the power supply for heat source 50 and the voltage across lamps 51 is adjusted so as to obtain about the same temperature at each of three locations $64_1$, $64_2$, $64_3$ on susceptor 65.

To increase wafer 70 throughput of reactor 10 (i.e., the number of wafers which can be processed in each batch of wafers), flat zone 67 must be enlarged. If susceptor 65 is lengthened in the vertical direction to provide a larger flat zone 67, either spacing Y between bottom $65_1$ and line 45A must be decreased, or reaction chamber 60 must be lengthened. As spacing Y decreases, the flat zone is moved further into the boundary region of heat source 50. Hence, uniformity of epitaxial layers grown in reactor 10 is affected by a change in spacing Y.

Placing a larger reaction chamber 60 within housing 15 of reactor 10 does not appear possible because the larger chamber necessarily changes the relationship between the cooling apparatus used to maintain the temperature of wall 41, the heat source 50 and the temperature in reaction chamber 60. As previously described, such changes affect the uniform growth of epitaxial layers so that even if the modification is possible, the increased batch capacity may not have epitaxial layers within industry uniformity standards.

If a vertically longer reaction chamber 60 is placed in housing 15, the upper and lower edges of the larger chamber 60 are necessarily closer to housing 15. The exterior of housing 15 is coupled to the ambient temperature of the room in which reactor 10 is contained, while wall 41 is at about 600° C. and susceptor 65 at about 900°–1200° C. Thus, as reaction chamber 60 becomes larger, heat source 50 must maintain the large temperature differential between reaction chamber 60 and the ambient room temperature, but the resistance to heat flow from reaction chamber 60 decreases because reaction chamber 60 is closer to housing 15. Hence, the energy from heat source 50 must compensate for any increased heat losses from chamber 60 that result from the reduced resistance to heat flow from chamber 60. A larger heat source affects the gas flow dynamics within chamber 60 in a manner similar to that previously described for changes in bell jar 40, and consequently the epitaxial layer growth within chamber 60

Moreover, the larger heat source may adversely affect other components in reactor 10. Reflector 52 behind heat source 50 is gold plated aluminum. Reflector 52 must be maintained at a temperature below the melting point of aluminum. Any increase in heat source 50 may result in overheating of the aluminum, which in turn would cause the plating to be deformed and subsequently introduce nonuniformities in heat source 50. Such nonuniformities would further alter the growth of epitaxial layers.

Reaction chamber 60 geometry (e.g., the size and shape of bell jar 40, the size and shape of susceptor 65, and the position of susceptor 65 within bell jar 40), heat source 50, gas flow, and forced air cooling of reactor 10 were selected to provide a maximum batch size with each wafer in the batch having an epitaxial layer within industry uniformity standards. To increase the batch size of reactor 10 requires changing at least reaction chamber 60 geometry so that more wafers can be placed within reaction chamber 60. In addition, other characteristics of the reactor would probably have to be modified.

Unfortunately, the characteristics of reactor 10 provide no guidance on how to increase the batch capacity of reactor 10 because, as described above, a change in one characteristic of the reactor affects other characteristics of the reactor. The gas flow dynamics in reaction chamber 60, the temperature profile in reaction chamber 60, the forced air cooling, heat losses from reaction chamber 60 and the reflection of radiant energy into and from reaction chamber 60 are all coupled so that a change in any one affects the others.

For example, if the vertical length of susceptor 65 is increased to hold more wafers, the increased length, in addition to the problems discussed above, increases drag on gas flow through reaction chamber 60. The change in gas flow affects the heat carried from the reaction chamber by the gas. In addition, heat source 50 must be increased to maintain the larger susceptor at a uniform temperature. The change in the heat source further affects the gas flow and the heat losses from the reaction chamber.

Therefore, a simple increase in the length of the susceptor alters many conditions in reactor 10 and each of these conditions affects the growth of epitaxial layers. Similarly, each change in reactor geometry, heat source, gas flow, and forced air cooling affects the uniform growth of epitaxial layers in reactor 10. Since the cumulative effect of these changes is unknown, the feasibility of increasing the batch size of reactor 10 is unknown.

As previously noted, reactor 10 was optimized to provide a maximum batch size within industry uniformity standards. Increasing the batch size of reactor 10 necessarily requires a reaction chamber geometry, heat source, and forced air cooling different from those currently used in reactor 10. Therefore, a new reactor which both increases the batch size of reactor 10 and maintains the epitaxial layer uniformity of reactor 10, is needed to improve the performance of reactor 10. As described more completely below, a prior art modification of reactor 10, which increased the batch size by about 50% for one size wafer, resulted in unacceptable variations in the uniformity of the epitaxial layers.

The prior art modification of reactor 10 did not use a larger susceptor, which would introduce the uncertainties discussed above, but rather the modification extended flat zone 67 of susceptor 65 in the vertical direction. Typically, flat zone 67 for wafers 70 is maintained a first selected distance 68 from top edge $65_2$ and bottom edge $65_1$ of susceptor 65, and a second selected distance 69 from side edges $65_3$, $65_4$. First and second distances 68, 69 are selected so that the surface temperature of susceptor 65 is nearly constant within flat zone 67.

The prior art modification of reactor 10 increased flat zone 67 of susceptor 65 by decreasing first selected distance 68. Therefore, flat zone 67 was closer to upper and lower edges $65_2$, $65_1$ of susceptor 65. To maintain the regions of flat zone 67 closest to edges 65₂, 65₁ at about 900° C.-1200° C. required raising the temperature of the susceptor over the increased length of flat zone 67. Therefore, a larger energy input to these regions was required to compensate for heat losses from edges 65₂, 65₁. Further, if the structure in regions immediately above and below the flat zone was heated by supplying more energy to these regions, the temperature differential between the adjacent structure and the flat zone would be lowered. The lower temperature differential would reduce the heat losses from the flat zone and the reduction in heat losses would help maintain a uniform temperature over the larger flat zone of susceptor 65.

Hence, in the prior art modification, heat source 50 (FIG. 2A) was replaced by heat source 50′, as illustrated in FIG. 2B. Reflector 52 (FIGS. 1 and 2A), discussed above, has a lip 55 at the top and bottom which is formed at about a 90° angle to the body of reflector 52. In the modified heat source 50′, as shown in FIG. 2B, ends 55′ of reflector 52′ were flared outward and reflector 52′ was broken into three segments 52₁′, 52₂′, 52₃′. A one-lighth to one inch spacer 56 was inserted between the segments The voltage on outer lamps 51₁′, 51₁₄′ was increased to 480 volts and two adjacent lamps 51₂′, 51₃′, 51₁₂′, 51₁₃′ were operated at 240 volts. The higher voltages on lamps 51₁′ and, ′-51₁₄′ provide a higher radiant energy output so as to compensate for the increased heat losses associated with moving flat zone 67′ closer to the periphery of reaction chamber 60. Flared ends 55′ of reflector 52′ reflected radiant energy over a larger area than reflector 55, which, as described above, should help minimize heat losses from the larger flat zone.

The change in heat source 50 coupled with overlap of wafers on susceptor 65 was intended to increase the flat zone for 125 mm diameter wafers so that the batch size could be increased from 12 wafers to 18 wafers. However, the variation in resistivity of the epitaxial layer of adjacent wafers was ±30%. The batch size for 100 mm, 150 mm and 200 mm was not changed by this modification, but the thickness and resistivity uniformities of the epitaxial layer for these wafer sizes decreased.

Accordingly, based on these results, the batch size of reactor 10 for 125 mm diameter can be increased by about fifty percent only if a ±30% variation in resistivity of the epitaxial layer of adjacent wafers is acceptable. In addition, the uniformity standards for other wafer sizes must also be relaxed. In general, a ±30% variation is not acceptable so that heat source 50′ (FIG. 2B) in combination with using a larger area of the susceptor is not a viable method for increasing the batch capacity of reactor 10.

These results demonstrate that increasing the batch capacity is not a simple process of scaling and compensating for anticipated effects of size changes. Rather, as described above, any change in reactor 10 results in a complex set of interactions which affect the uniformity of the epitaxial layer. Further, given the poor results obtained by increasing the energy output of the portion of heat source 50′ closest to housing 15, increasing the capacity of reactor 10 by using a larger susceptor, as described above, does not appear feasible because the larger susceptor would appear to require a heat source similar to that illustrated in FIG. 2B. Therefore, the batch capacity of reactor 10, as given in Table 1, appears to be the best that can be achieved while maintaining industry standards for uniformity of the epitaxial layers.

SUMMARY OF THE INVENTION

Contrary to the results achieved in the prior art, according to the principles of this invention, a prior art barrel epitaxial reactor is configured to achieve an increased batch size. Unlike the prior art modifications which resulted in poor resistivity uniformity, the epitaxial barrel reactor, according to the principles of this invention, provides epitaxial layers on adjacent wafers having resistivity uniformity and thickness uniformity at least of the same quality as in the lower capacity prior art reactors.

The increased batch size and the uniformity of the epitaxial layers are achieved by a unique set of conditions which I discovered yield epitaxial thicknesses and resistivities of at least as good quality as in the prior art, but which involve the use of a different reactor geometry, a different heat source, and different forced air cooling. Further, the larger heat source and the larger reaction chamber have been utilized within the housing of the prior art reactor and yet the uniformity of epitaxial layers grown in the new reactor is essentially indistinguishable from the uniformity of the original reactor. This result is in sharp contrast to previous means for increasing the batch capacity of the prior art barrel epitaxial reactor In one embodiment, a reaction chamber having a flat zone 25-50% greater than the flat zone of the prior art reactor and a radiant energy heat source for providing uniform heat energy over the larger flat zone are contained within the housing of the prior art epitaxial reactor. The radiant energy heat source comprises banks of lamps which produce radiant energy in the short wavelength region, i.e., approximately 1 micron or below. Each bank of lamps includes a column of lamps with a highly polished reflector. The energy output of each lamp in the bank is directly proportional to the voltage applied to the lamp.

To achieve a uniform temperature across the flat zone of a susceptor in the reaction chamber, the heat source is about 25% longer than the flat zone so that a top of the susceptor is positioned a selected distance above a top of the heat source. The voltage applied to the lamps is such that the energy output of the lamps over the length of the flat zone is approximately uniform and the energy output from the lamps in regions on the column extending beyond the flat zone is in the range of approximately 25-50% greater than the energy output of the lamps over the length of the flat zone. This energy distribution in combination with the geometry of the reaction chamber and the forced air cooling, described below, results in a reactor with an increased batch size having epitaxial layers within industry uniformity standards. In contrast, the energy distribution used to increase the batch size in the prior art resulted in unacceptable uniformity variations.

The reaction chamber of this invention is contained within a bell jar with a smaller transition region than prior art bell jars and a larger vertical wall length relative to the total length of the bell jar. Moreover, the position of the susceptor within the bell jar is raised so that the top of the susceptor is approximately 0.5-2.0 inches, and preferably about 1.0 inch, above the top of the reflector used with the heat source. The bell jar and the heat source of this invention are connectable to the gas flow apparatus, the forced air flow supply means, the susceptor rotation means, and the power control electronics of the prior art reactor.

In addition to the larger reaction chamber in the new bell jar and the larger heat source, according to the principles of this invention, the epitaxial reactor of this invention includes a means for coupling the blower of the prior art reactor to a supply plenum which in turn provides forced air flow through the heat source and to a section of the reaction chamber wall beyond an end of the heat source. Thus, forced air flow is established along the wall of the reaction chamber so as to maintain the wall of the reaction chamber at a uniform cold temperature relative to the temperature of the susceptor with the larger heat source of this invention.

According to the principles of this invention, a method for improving the batch capacity of the prior art barrel epitaxial reactor is provided by increasing the reaction chamber size and increasing the radiant heat source so that a uniform temperature is maintained over a larger flat zone in the reaction chamber. In addition, in the method of this invention, the forced air flow from a prior art blower is distributed so that a positive air flow is maintained along the exterior wall of the reaction chamber and consequently the wall is maintained at a uniform cold temperature. relative to the temperature of the reaction chamber The variation in thickness of the epitaxial layer among adjacent wafers and the variation in resistivity of the epitaxial layer among adjacent wafers processed in the reactor of this invention are the same or better than the variations of the prior art barrel epitaxial reactor and significantly better than the the prior art reactor which utilized a larger portion of the susceptor.

DETAILED DESCRIPTION

According to the principles of this invention, prior art barrel epitaxial reactor 10 (FIG. 1A) is reconfigured so as to achieve an increased batch size for 100 mm, 125 mm and 200 mm diameter wafers. Unlike the prior art modification illustrated in FIG. 2B, which was used to increase the batch size and which resulted in poor resistivity uniformity, the epitaxial barrel reactor according to the principles of this invention provides epitaxial layers on adjacent wafers having the same, or better, resistivity uniformity as reactor 10 (FIG. 1A) and having at least the same quality thickness uniformity as reactor 10. The increased batch size and epitaxial layer uniformity within industry standards are obtained with a reaction chamber geometry, heat source, and forced air cooling which provide a unique set of conditions for growth of epitaxial layers.

Since the epitaxial reactor of this invention maintains the epitaxial layer within industry quality standards for increased batch sizes, processing cost per wafer is reduced. Further, since many parts of reactor 10 are reused in the epitaxial reactor of this invention, the overhead costs associated with the reactor of this invention are minimized.

Figure 1A:
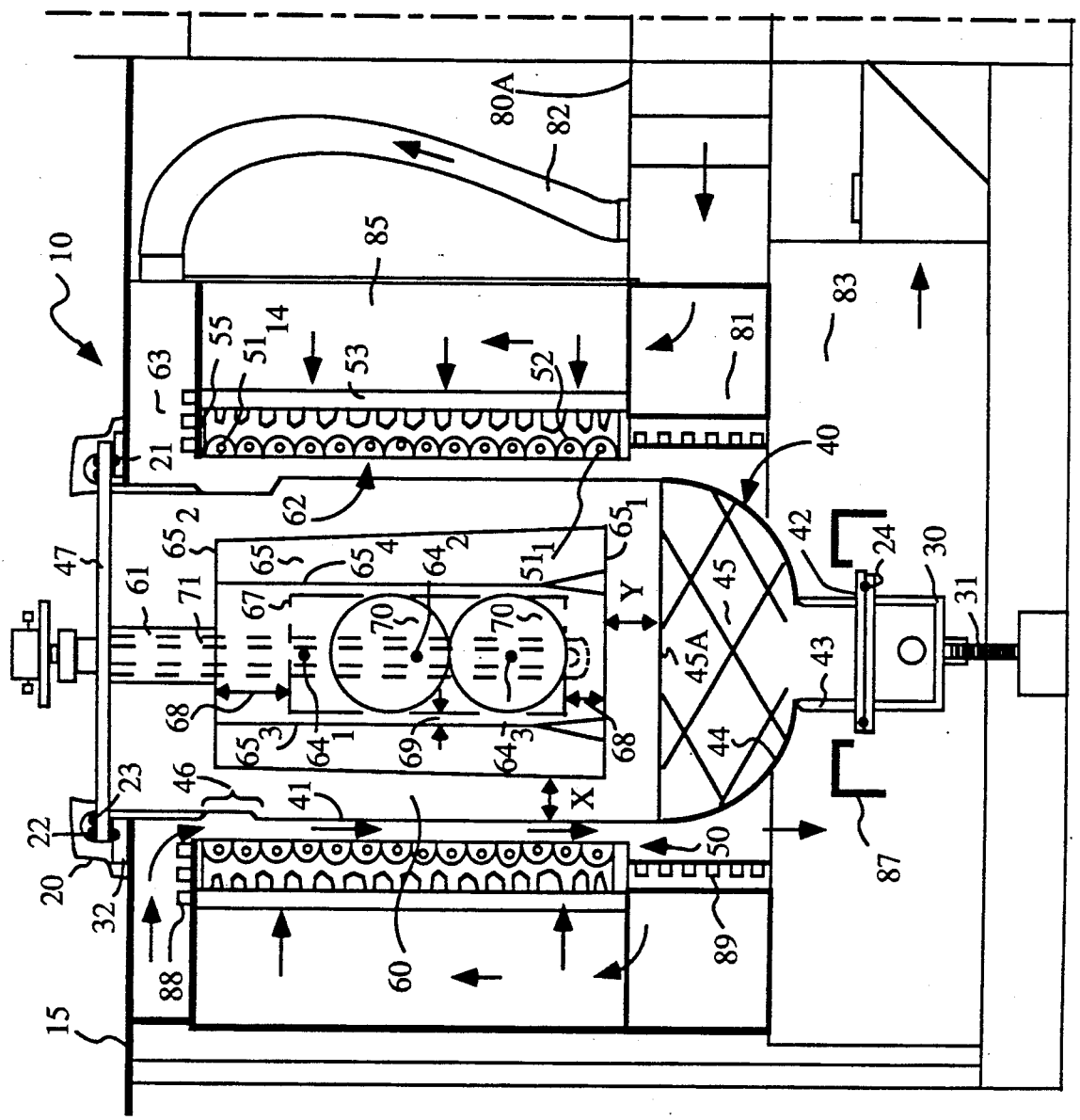
FIG. 1A illustrates a side cross-sectional view of a prior art epitaxial barrel reactor.

The enhanced batch capacity of this invention is achieved with a flat zone 167 (FIG. 3A) which is up to 50% greater than the flat zone of reactor 10 (FIG. 1A). Moreover, reaction chamber 160 (FIG. 3A), which contains the 5-50% greater flat zone 167 of epitaxial reactor 100 of this invention (FIG. 3A), is contained within housing 15 of prior art reactor 10 (FIG. 1A).

Unlike the prior art technique for expanding the flat zone using heat source 50' (FIG. 2B), which increased the power density at the edges of the flat zone and decreased the power density at selected regions within the flat zone, I have discovered that by providing a continuous heat source 150 across flat zone 167 of this invention, the average power density absorbed by flat zone 167 can be made approximately uniform. Since flat zone 167 is increased by 25-50%, a heat source 150, which is in the range of 10-40% larger than prior art heat source 50, is contained in reactor 100 of this invention so that a uniform temperature is maintained across flat zone 167. Further, the temperature of wall 141, the heat losses and the reflected heat energy in reactor 100 are maintained so that larger heat source 150 provides the uniform temperature across larger flat zone 167 without degrading the performance of other components in reactor 100.

Hence, according to the principles of this invention, a larger heat source 150, a larger susceptor 165, and a larger reaction chamber 160 are used in a confined volume, housing 15, to provide a larger batch capacity with excellent uniformity. In contrast, as previously described, the prior art attempts to use a larger heat source 50' within housing 15 resulted in unacceptable variations in epitaxial layer resistivity. Prior art heat source 50' did not have a uniform energy output over the larger flat zone because spacers 56 were added to the heat source.

To achieve the enhanced batch capacity, in one embodiment, the prior art 16.75 inch susceptor 65 (FIG. 1A) was replaced with a 21.5 inch graphite susceptor coated with silicon carbide. While in this embodiment a graphite susceptor was used, susceptor 165, as described more completely below, can be made from any material that (i) absorbs radiant energy from heat source 150, (ii) provides a uniform surface temperature, and (iii) does not contaminate wafers 70. Heat source 50 of reactor 10 was replaced with a new heat source 150, bell jar 40 with new bell jar 140 and quartz hanger 61, upper plenum 63, vertical riser 85, and exhaust plenum 83 of reactor 10 were replaced by quartz hanger 161, upper plenum assembly 163, vertical riser 185 and exhaust plenum 183, respectively.

In addition, an air flow deflector 188 was placed at the inlet of pipe 82 in supply plenum 81. Outlet 80A of blower 80 was lowered by a distance of approximately 1.5 inches and a transition duct 179 couples outlet 80A of blower 80 with supply plenum 81.

The above-mentioned new components of reactor 100 are included in the package of this invention for reconfiguring prior art reactor 10 so as to increase the batch capacity. As described more completely below, in one embodiment of reactor 100 of this invention, susceptor 165, heat source 150, bell jar 140, upper plenum 161, vertical riser 185 and exhaust plenum 183 are contained within housing 15 so that gas ring 20, rotation means for susceptor 165, supply plenum 81, heat exchanger 84, cooling plate 88, water cooled wall 89, guard ring 87, blower 80 and the other electrical and control components of prior art reactor 10 can be utilized.

Since susceptor 165 (FIG. 3A) is 4.75 inches longer than susceptor 65 of reactor 10 (FIG. 1A) in one embodiment, a longer heat source 150 (FIG. 3A) is required to provide a source of uniform radiant heat energy across flat zone 167. As explained more completely below, heat source 150 is about 4.5 inches longer than heat source 50 of reactor 10 (FIG. 1A).

To mount heat source 150 within housing 15 required a reduction in the height of both exhaust plenum 183, and upper plenum assembly 163. Specifically, upper plenum 163 was shortened by one inch, and exhaust plenum 183 was shortened by 3.5 inches. The volume of upper plenum 163 and the volume of exhaust plenum 183 were reduced, but heat source 150 was increased. Therefore, the forced air cooling of the reaction chamber 160, as described more completely below, has been changed in comparison to prior art reactor 10.

Figure 3A:
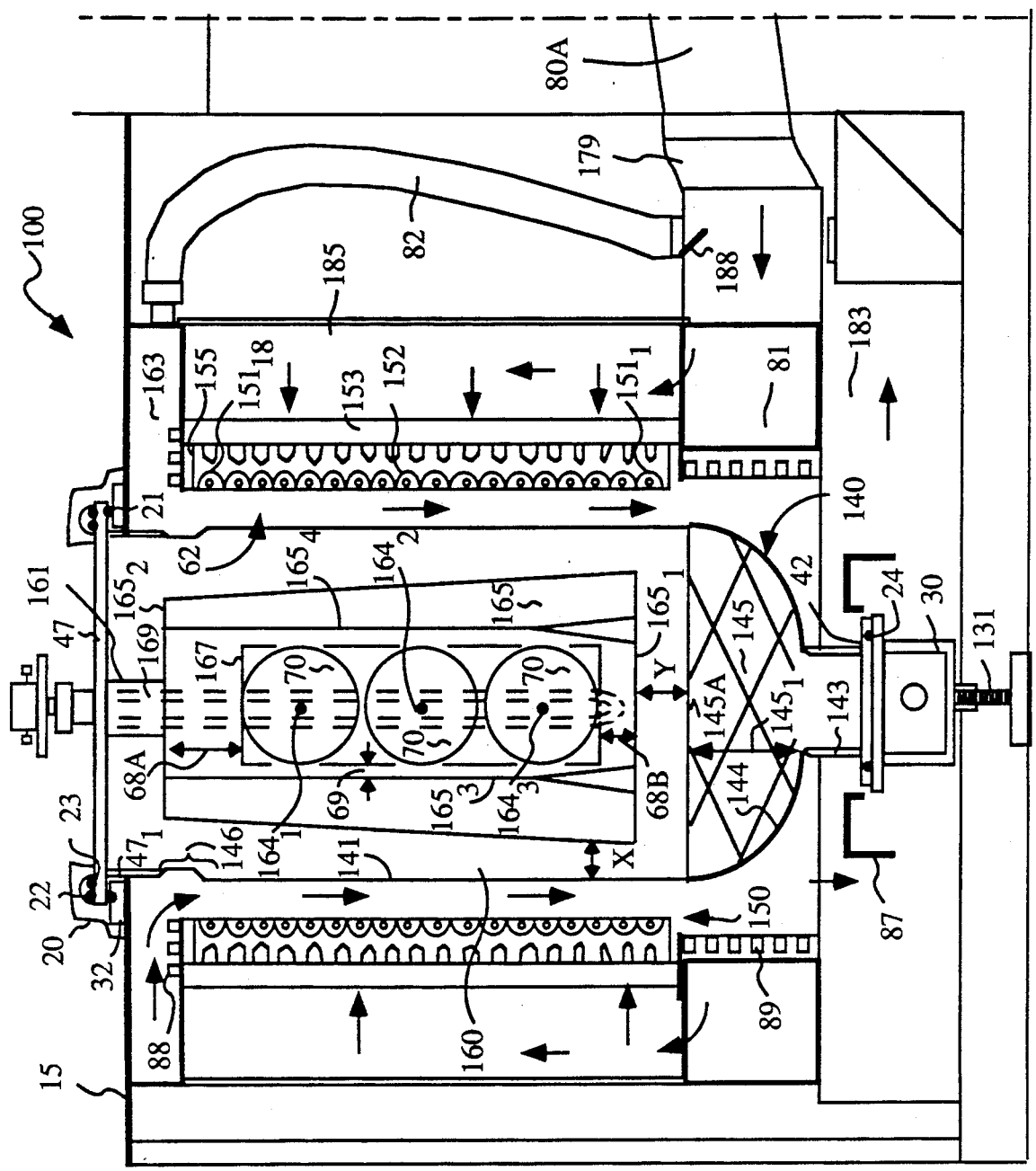
FIG. 3A illustrates a side cross-sectional view of an epitaxial barrel reactor according to the principles of this invention.

Spacings X and Y, as illustrated in FIG. 3A, are maintained between susceptor 165 and the boundaries of reaction chamber 160. Spacing X is in the range of approximately 1.8 inches to 2.5 inches and spacing Y is in the range of approximately 1 inch to 2 inches. Since susceptor 165 is about 4.5 inches longer, reaction chamber 160 must also be about 4.5 inches longer so that spacing Y is maintained between bottom $165_1$ of susceptor 165 and the bottom of reaction chamber 160. Therefore, bell jar 40 of reactor 10 could not be used in this invention and a new bell jar 140 was required. The new bell jar changes the geometry of reaction chamber 160, as described below. As previously described, changes in reaction chamber geometry directly affect the conditions required for uniform growth of epitaxial layers within the chamber. The gas dynamics, as previously described, the heat losses, and possibly the temperature profile within the bell jar are changed.

Bell jar 140, which has approximately a 14 inch outer diameter, is 1.1 inches longer than prior art bell jar 40 of reactor 10 (FIG. 1A). Support assembly 131 was modified so that bell jar 140 is properly positioned within housing 15. Also, approximately one inch was removed from flange $47_1$ of opaque top flange 47. Vertical support 143 is connected to flange 42 and O-ring 24 provides a seal between flange 42 and exhaust cup 30.

Increasing the length of bell jar 140 by 1.1 inches is not sufficient to increase the length of reaction chamber 160 by about 4.5 inches. Thus, transition zone 146 was reduced from three inches in reactor 10 (FIG. 1A) to 1.5 inches in reactor 100 (FIG. 3A). The 1.1 inch longer length of jar 140 plus the 1.5 inches eliminated from transition region 146 provides 2.6 inches of the required 4.5 inches. An additional 0.5 inch was obtained by reducing the length of lower vertical support 143 for bell jar 140. These changes provided 3.1 inches of the additional 4.5 inches in length needed for reaction chamber 160.

The additional 1.4 inches required for reaction chamber 160 were achieved (i) by moving susceptor 165 up in bell jar 140 and (ii) by moving bead-blasted area 145 down so as to maintain the distance Y between bead-blasted area 145 and bottom $165_1$ of susceptor 165. Specifically, hanger 161 suspends susceptor 165 in bell jar 140 so that top $165_2$ of susceptor 165 is approximately 0.5–2.0 inches, preferably about 1.0 inches, above top 155 of reflector 152. Bead-blasted area 145 was moved down so that a vertical distance $145_1$ from vertical support 143 to line 145A was about one inch less than the corresponding distance in reactor 10 (FIG. 1A).

Hence, reactor 100 of this invention required development of a new bell jar 140 with a smaller transition region 146 and a longer vertical wall length 141 relative to the total length of bell jar 140. The relationship of susceptor 165 within bell jar 140 was also changed. Therefore, not only were the boundary conditions at the top and bottom of the reaction chamber 160 modified by moving the top and bottom closer to housing 15, but also the configuration of reaction chamber 160 within bell jar 140 was modified. Therefore, while reactor 100 (FIG. 3A) is somewhat similar in appearance to reactor 10 (FIG. 1A), the boundary conditions as well as the relationship between reaction chamber 160, susceptor 165 and heat source 150 have been modified to achieve the enhanced performance of reactor 100.

Figure 3B:
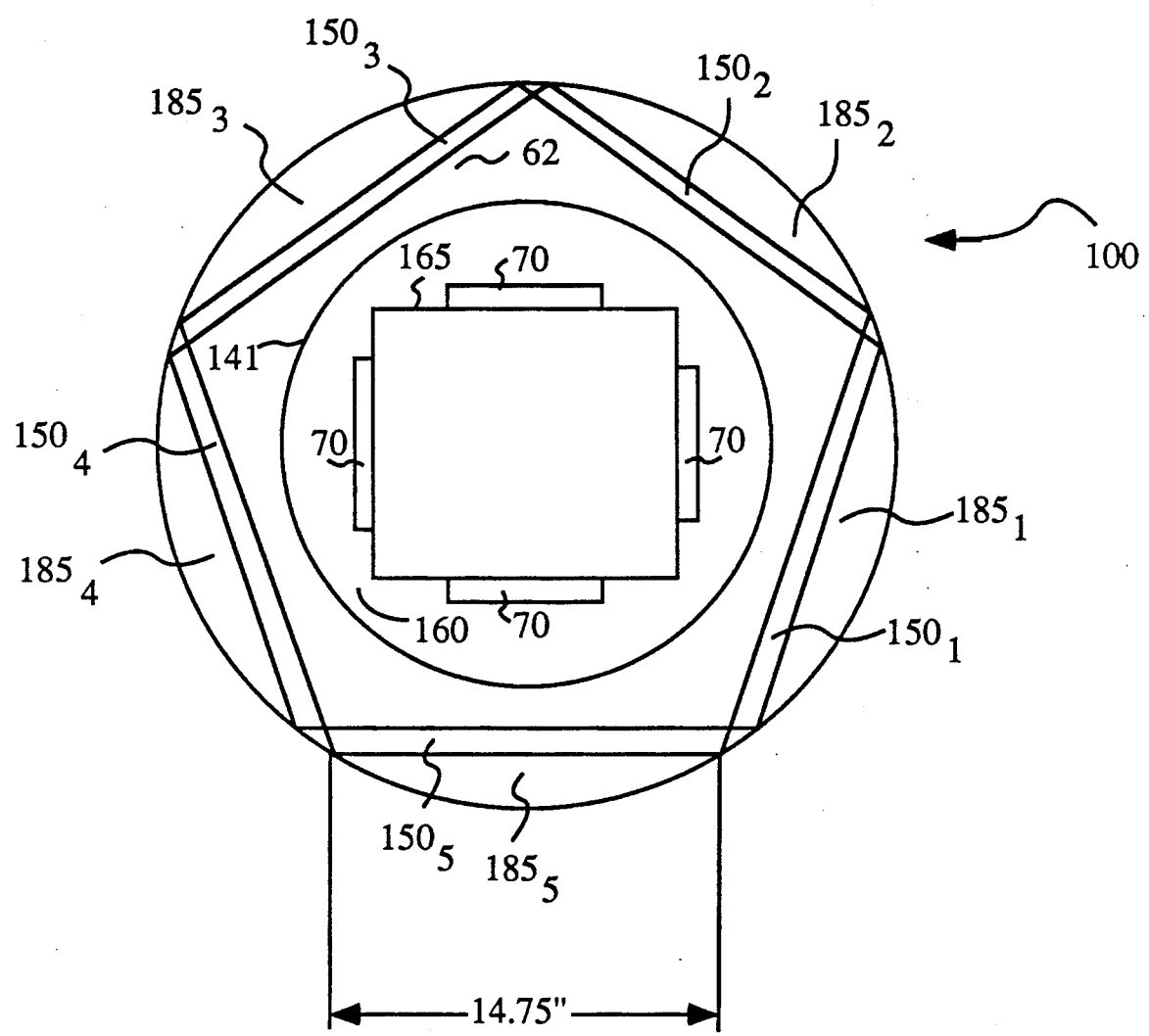
FIG. 3B illustrates a horizontal cross-sectional view of the banks of lamps in the heat source of this invention and the reaction chamber of this invention.

Heat source 150, in this embodiment, consists of five banks of quartz halogen lamps 151. The five banks of lamps in heat source 150 form a pentagon about bell jar 140 (FIG. 3B). In FIG. 3B, only the five banks of lamps and bell jar 140 are illustrated in the horizontal cross-sectional view for clarity. The horizontal width of each column, as shown in FIG. 3B, is approximately 14.75 inches. The outside diameter of reaction chamber 160 is approximately 14 inches Each of the five banks of heat source 150 has eighteen lamps 151. As illustrated in FIG. 3A, each bank of lamps in heat source 150 forms a column that is separated from an exterior surface of wall 141 of reaction chamber 160 by region 62. The vertical length of the column of lamps 151, as illustrated in FIG. 3A, is about 25% greater than the length of flat zone 167. Specifically, in one embodiment, flat zone 167 is sixteen inches in length, and each bank of lamps 151 is about 20.25 (18 lamps × 1.125 inches/lamp) inches in length. As previously described, the vertical dimension is defined as the dimension in the direction extending from the gas entrance to chamber 160 to the gas exit to chamber 160.

Each of lamps 151 is a quartz halogen lamp with a tungsten filament that produces radiant energy in the short wavelength range, i.e., approximately one micron or below. One source of lamps suitable for use in this invention is sold under Model No. QIR 480-6000E by Ushio American, Inc. of Torrance, Calif. 90502. The specifications for these lamps are shown in Table 3.

TABLE 3

| Specification for Radiant Energy Lamps 151 | | | | | |
|---|---|---|---|---|---|
| Design Volts (v) | Design Watts (W) | Color Temp. (°K.) | Maximum Overall Length (mm) | Maximum Light Length (mm) | Bulb Diameter (mm) |
| 480 | 6,000 | 3,150 | 300 | 248 | 11 |

Each lamp 151 is mounted in a 1.125 inch parabolic gold plated highly polished reflector. A reflector assembly suitable for use in this invention is available from Vector Technical Group, Inc. of Santa Clara, Calif., and is sold under the name of Spiral-Array Reflector Extended and part number 5815.

As previously described, the radiant energy from each lamp 151 is directly proportional to the voltage across the lamp. As illustrated in Table 4, a higher voltage is applied to lamps $151_1$–$151_3$ and $151_{16}$–$151_{18}$ on the upper and lower periphery respectively of reaction chamber 160. Unexpectedly, the expansion of chamber 160, placement of susceptor 165 and placement of heat source 150 closer to housing 15 did not require increasing the voltage applied to the lamps $151_1$, $151_{18}$ by a factor of two over the voltage applied to lamps $151_4$–$151_{15}$ at the center of heat source 150 as suggested by prior art heat source 50' of FIG. 2B.

The outermost lamps $151_1$, $151_{18}$ of each bank have an applied voltage of 350 volts while the next two lamps $151_2$, $151_3$, $151_{16}$, $151_{17}$ each have an applied voltage of 300 volts. The remaining twelve lamps $151_4$–$151_{15}$ have an applied voltage of 240 volts. Since heat source 150 has four more lamps than heat source 50 of reactor 10 (FIG. 1A), heat source 150 has a total energy output approximately 25% greater than heat source 50.

Lamps $151_4$–$151_{15}$, which are about 13.5 inches in vertical length, provide a uniform energy output and are centered vertically about the center of flat zone 167. Thus, the average radiant heat energy across flat zone 167 is approximately uniform. The energy from lamps $151_1$–$151_2$ and $151_{17}$–$151_{18}$ is applied to the portions of susceptor 165 below flat zone 167 and above flat zone 167, respectively. Also, lamps $151_3$ and $151_{16}$ provide some energy to the lower and upper boundary respectively of flat zone 167. The energy output of each of these lamps $151_1$–$151_3$ and $151_{16}$–$151_{18}$ is in the range of 25%–50% greater than the energy output of each of lamps $151_4$–$151_{15}$. Thus, the average energy output of heat source 150 in the regions of heat source 150 which extend beyond flat zone 167 is approximately 25–50% greater than the average energy output of heat source 150 over flat zone 167.

The higher energy output from lamps $151_1$–$151_3$ and $151_{16}$–$151_{18}$ compensates for heat losses from susceptor 165 so that the temperature distribution across flat zone 167 is uniform. Heat source 150 of this invention maintains the surface temperature of susceptor 165 in the range of 900°–1200° C. and preferably 1100° C.±5° C.

TABLE 4

| Voltage Distribution for Each Bank of Heat Source 150 | | | |
|---|---|---|---|
| Lamp No. | Voltage | Lamp No. | Voltage |
| $151_1$ | 350 | $151_{10}$ | 240 |
| $151_2$ | 300 | $151_{11}$ | 240 |
| $151_3$ | 300 | $151_{12}$ | 240 |
| $151_4$ | 240 | $151_{13}$ | 240 |
| $151_5$ | 240 | $151_{14}$ | 240 |
| $151_6$ | 240 | $151_{15}$ | 240 |
| $151_7$ | 240 | $151_{16}$ | 300 |
| $151_8$ | 240 | $151_{17}$ | 300 |
| $151_9$ | 240 | $151_{18}$ | 350 |

Figure 2A:
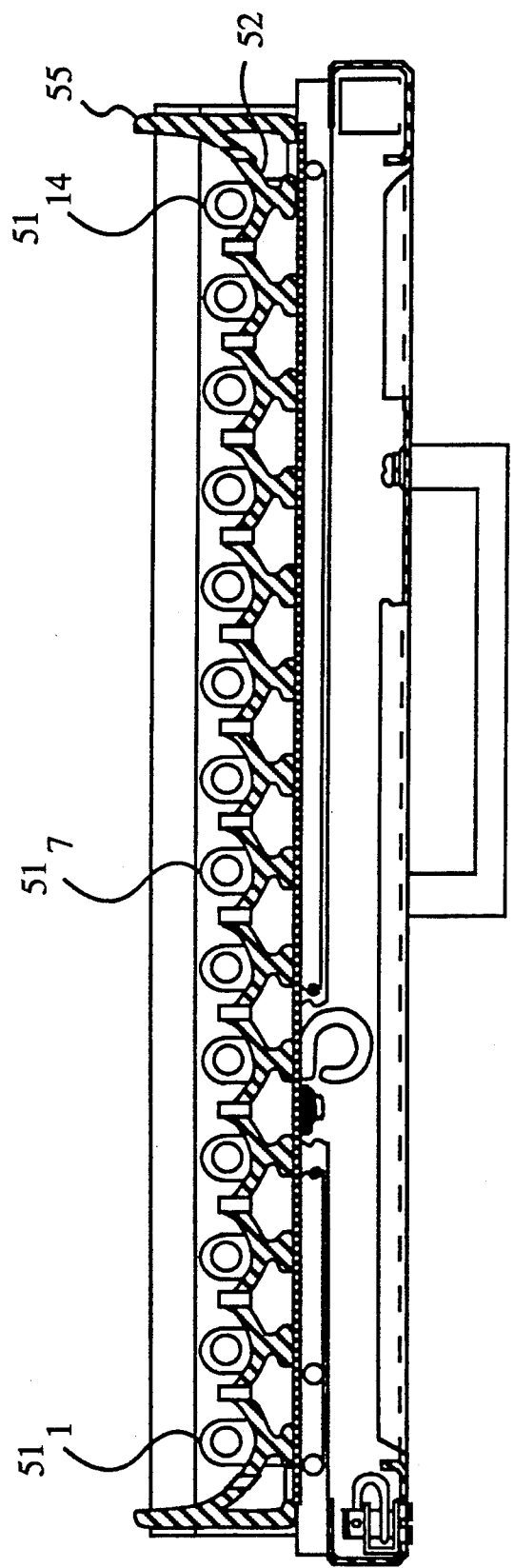
FIG. 2A illustrates a bank of quartz halogen lamps used in the prior art epitaxial barrel reactor of FIG. 1.
Figure 2B:
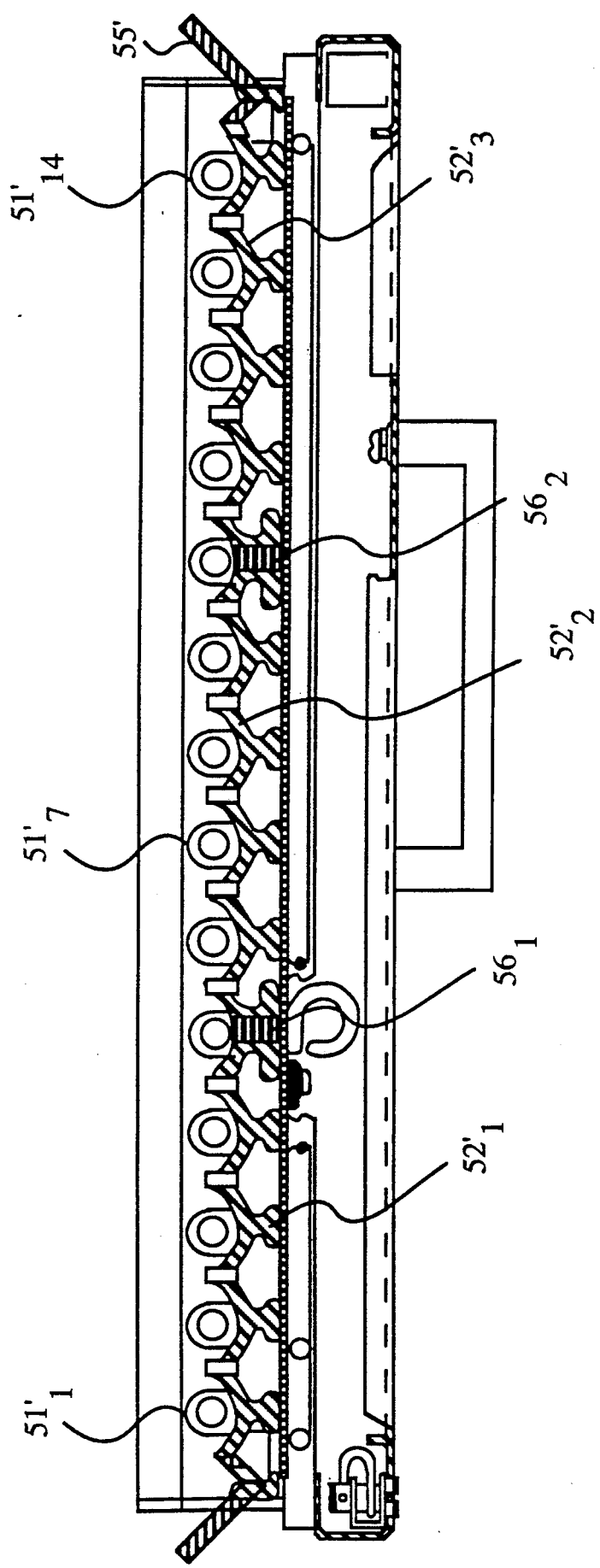
FIG. 2B illustrates a bank of a modified heat source used in the epitaxial barrel reactor of FIG. 1 so as to increase the capacity of that reactor.

Unlike the prior art heat source 50' of FIG. 2B, which increased the energy at the periphery of the heat source and decreased the energy at two regions in the interior of the heat source, heat source 150 is uniform across the interior and increases at the periphery. Further, the energy output of lamps at the periphery of heat source 150 is less than 50% greater than the energy output of lamps at the interior of heat source 150 and not 100% greater as in heat source 50' (FIG. 2B).

Hence, heat source 150 of this invention in combination with the new reactor geometry maintains a uniform temperature across the flat zone without increasing the energy supplied to the periphery of the susceptor. Such a result is unexpected, because, as previously described, an increased flat zone requires a larger susceptor which in turn requires a larger reaction chamber. A larger reaction chamber results in the boundaries of the reaction chamber being closer to housing 15, and heat source 150 must maintain the temperature differential between reaction chamber 160 and housing 15 even though the resistance to heat losses are decreased by the increased size of reaction chamber 160.

Figure 1A:
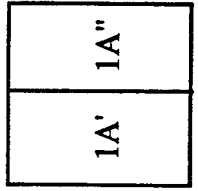
Figure 1B:
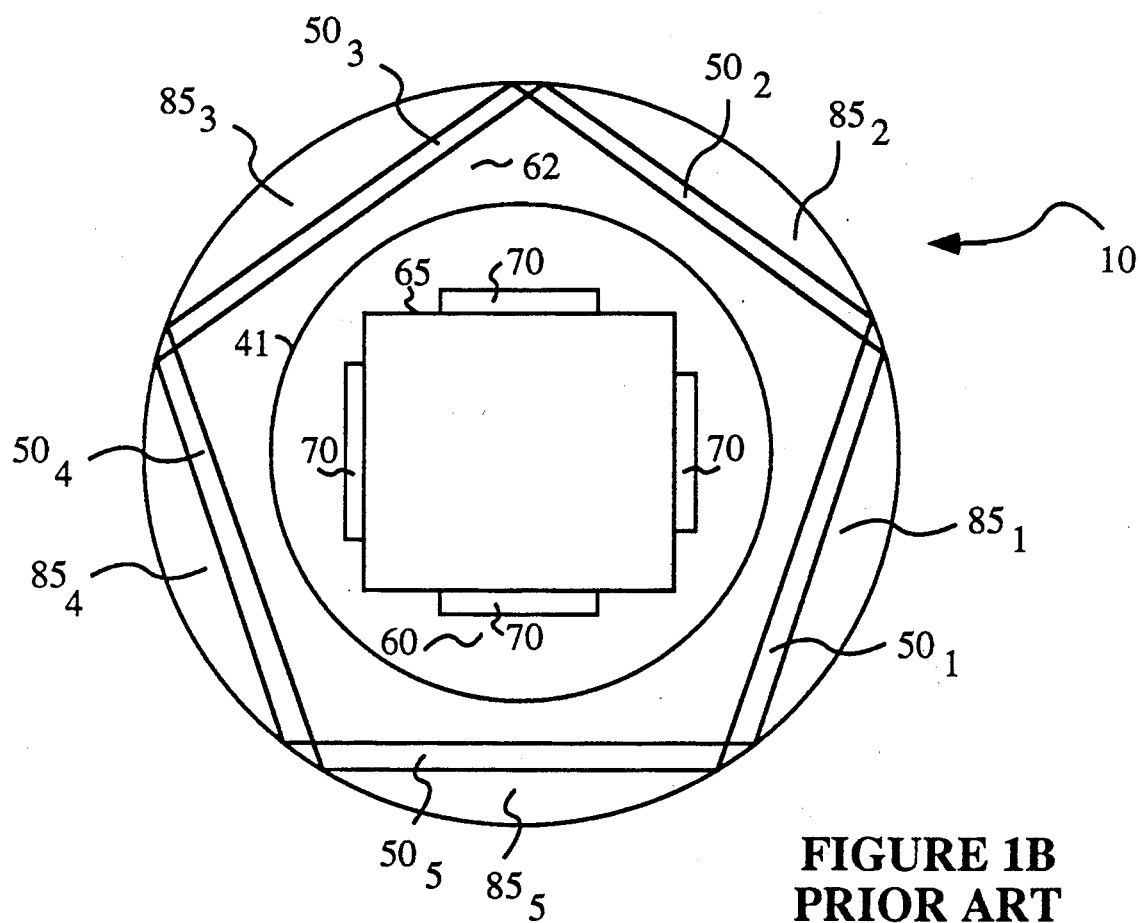
FIG. 1B illustrates a horizontal cross-sectional view of the banks of lamps in the heat source and the reaction chamber of the prior art epitaxial barrel reactor.

Each bank of lamps 151 in heat source 150 is separated into three groups: a first group consisting of lamps $151_1$–$151_5$; a second group consisting of lamps $151_6$–$151_{13}$; and a third group consisting of lamps $151_{14}$–$151_{18}$. Recall that for reactor 10 in FIG. 1, three silicon controlled rectifiers were used to drive the three groups of lamps in each bank of heat source 50. These three silicon controlled rectifiers are also used with the three groups of lamps 151, as defined above.

Figure 4:
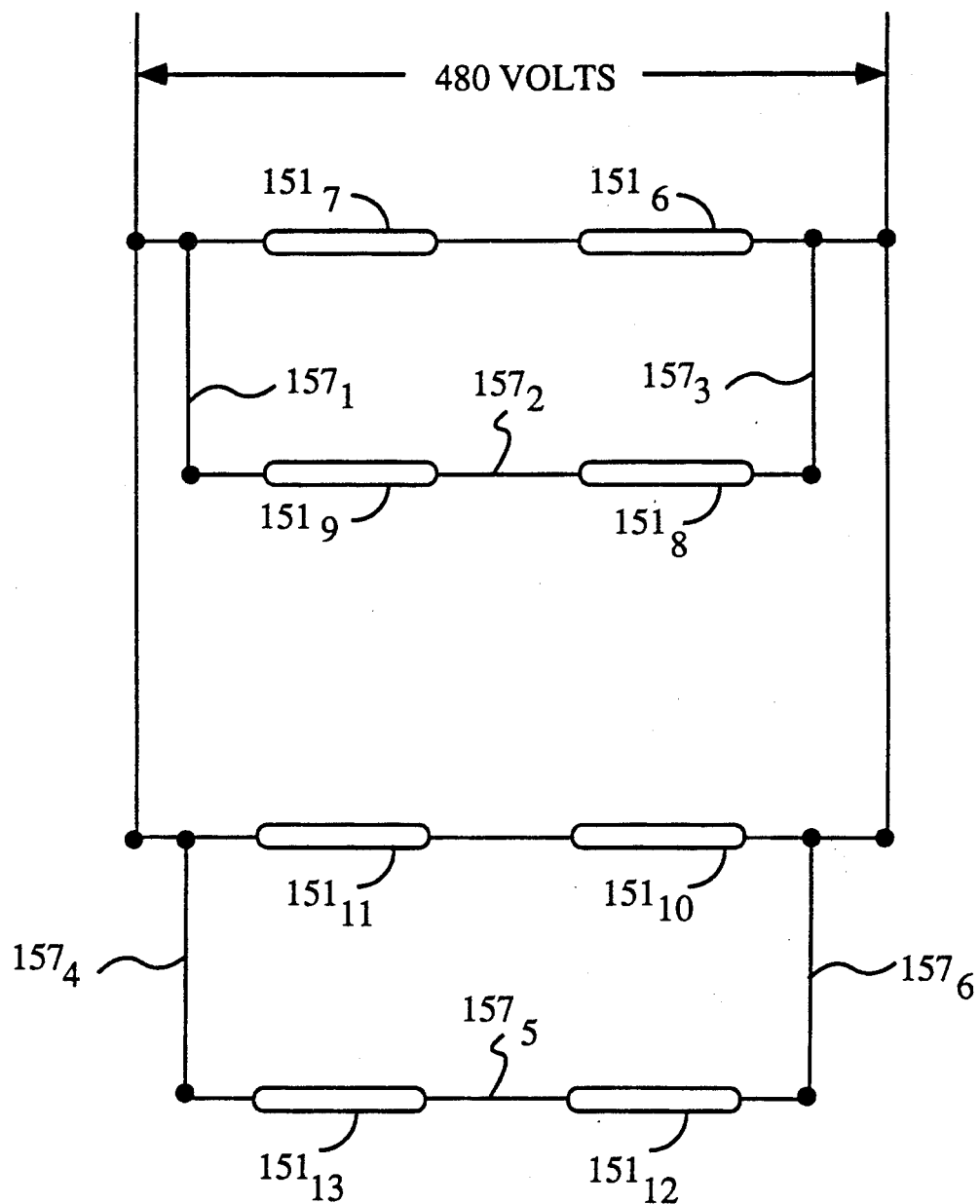
FIG. 4 is a wiring diagram for the second group of lamps in each bank of the heat source of this invention.

Since the power of the first and third groups of lamps 151 in reactor 100 of this invention and in prior art reactor 10 are the same, no modification in the SCR circuitry was required. To connect the second group of eight lamps to the SCR required wiring lamps $151_6$–$151_{13}$ in a series parallel combination, shown in FIG. 4, so that the wiring from the second group of lamps was directly connectable to the prior art fourteen pin connectors. This wiring is performed on the lamp modules using jumpers 157 so that lamps $151_6$–$151_{13}$ can be coupled directly to the original connectors of reactor 10. Further, the second SCR, as previously described, had a lower power utilization, so that the SCR can accommodate the load associated with the additional lamps.

Quartz hanger 161 of this invention also includes a sheath with a path 169 for insertion of an infrared sensor so that the sensor can be positioned at three locations 164 within susceptor 165. Each of the three locations permits measurement of the radiant energy from one of the three groups of lamps in a bank of lamps as defined above. The infrared sensor is the same as the sensor used with reactor 10 (FIG. 1A) except in this invention the sensor has been lengthened so that the larger vertical distance of susceptor 65 can be traversed. The infrared sensor is connected to the closed loop temperature control system that was used in prior art reactor 10 so that the voltage to each group of lamps in a bank can be controlled. Hence, the total radiant energy output of heat source 150 of this invention has been increased by over 25% relative to heat source 50 of reactor 10 (FIG. 1), but heat source 150 (FIG. 3) is directly connectable to the prior art voltage controller and circuitry so that no additional connections or hardware are required to accommodate larger heat source 150.

Side wall 141 of quartz bell jar 140, which is about 3 millimeters thick in one embodiment, is transparent so that the radiant energy from heat source 150 passes through the wall and is incident directly upon susceptor 165. While in this embodiment side wall 141 is quartz, which absorbs little or none of the radiant heat energy from source 150, any material, which absorbs little or no radiant heat energy and which can withstand temperatures of about 600° C., can be used to form reaction chamber wall 141. Susceptor 165 is rotatably connected to the rotation means of the prior art reactor by quartz hanger 161 so that no modifications are required to the rotation means. Susceptor 165 slopes outward from top $165_2$ to bottom $165_1$ by 2° so that the cross-sectional width of bottom $165_1$ is larger than the cross-sectional width of top $165_2$. However, the bottom portion of susceptor 165 is trimmed so as to maintain spacing X between susceptor 165 and wall 141 in the range of about 1.8 inches to 2.5 inches.

A different susceptor is used for each wafer size. Specifically, for 125 mm diameter wafers, a six-sided susceptor is used. For 100 mm diameter wafers, either a seven- or eight-sided susceptor is used. For 150 mm diameter wafers, a five-sided susceptor is used, and for 200 mm diameter wafers, a four-sided susceptor is used.

The important factors for susceptor 165 are (i) that first selected distance 69, as described above, is at least 0.1 inches and (ii) that second selected distances 68A, 68B are chosen such that the surface temperature of susceptor 165 is approximately uniform along the vertical length of flat zone 167.

In addition to a uniform heat source, such as that applied by source 150, the rotation of susceptor 165, and the positioning of wafers 70 on susceptor 165, the correct operation of reactor 100 requires (i) that wall 141 of bell jar 140 remain at a cold temperature relative to the temperature of susceptor 165 and (ii) that the temperature of wall 141 be approximately uniform. If the temperature of wall 141 increases or is not uniform, the wall boundary conditions on reaction chamber 160 change, which in turn, as previously described, causes growth of epitaxial layers which are not uniform. Therefore, the forced air circulation must compensate for the larger heat source 150 and must maintain wall 141 at a cold uniform temperature relative to the temperature of susceptor 165.

Blower 80, in one embodiment, rotates at about 3,450 revolutions per minute and provides an air flow of from about 8,000 to about 15,000 cubic feet per minute to supply plenum 81. Supply plenum 81 has a vertical riser 185 which is connected to heat exchanger 153 mounted on the back of lamp assemblies 150. Thus, air in supply plenum 81 is passed through heat exchanger 153 on the back of lamp assemblies 150 through reflector 152 and around lamps 151 into region 62 between bell jar wall 141 and lamp assemblies 150. In FIG. 3A, the air flow is represented by arrows without a reference numeral.

However, the pressure difference created by the resistance to air flow through lamp assembly 150 does not provide sufficient air flow to plenum region 161 to maintain a positive air flow down wall 141 of jar 140. Accordingly, air scoop 188 is provided in supply plenum 81 at the inlet of two-inch outer diameter pipe 82 so that a fraction of the air from blower 80 is diverted directly into pipe 82 and subsequently to upper plenum region 161.

Thus, forced air flow from region 161 and from vertical riser 185 flows down the surface of side wall 141, which is exterior to reaction chamber 160, into exhaust plenum 183. The air passes through exhaust plenum 183 into heat exchanger 84. The temperature of the return air to heat exchanger 84 is in the range of approximately 90°-105° C. The water flow through heat exchanger 84 has been increased to six gallons per minute by changing the flow restrictor in the water supply line to heat exchanger 84.

The air is cooled as it passes through heat exchanger 84 and the cooled air from heat exchanger 84 passes into blower supply plenum 86. The air temperature of the air provided to blower supply plenum 86 is in the range of approximately 55°-60° C. Hence, not only has heat source 150 been directly coupled to the prior art circuitry but also the forced air cooling has been accomplished using blower 80, heat exchanger 84, and supply plenum 81 of prior art reactor 10. In addition, cooling plate 88 in upper plenum 161 and water cooled wall 89 on supply plenum 81 have not been changed.

Table 5 lists the batch sizes (i) for reactor 10 of FIG. 1A, (ii) for reactor 10 modified to include the heat source of FIG. 2B, and (iii) for reactor 100 of this invention.

TABLE 5

| System Type | Batch Capacity | | | |
|---|---|---|---|---|
| | Wafer Diameter | Thickness Uniformity | Resistivity Uniformity | Batch Size |
| Prior Art Epitaxial | 100 | 4.5% | 6% | 24 |
| Reactor 10 | 125 | 4.5% | 6% | 12 |
| | 150 | 4.5% | 6% | 10 |
| | 200 | ~5.0% | ~7% | 4 |
| Prior Art Epitaxial | 100 | ~4.5% | ~9% | 24 |
| Reactor 10 with heat | 125 | ~5.0% | ~30% | 18 |
| source of FIG. 2B | 150 | ~5.0% | ~9% | 10 |
| | 200 | ~5.0% | ~7% | 4 |
| Epitaxial Reactor | 100 | ~4.5% | ~6% | 32 |
| 100 of this | 125 | ~4.5% | ~5% | 18 |
| invention | 150 | ~4.5% | ~4% | 10 |
| | 200 | ~6.0% | ~7% | 8 |

As shown in Table 5, the variation in resistivity of the epitaxial layer between adjacent wafers processed in reactor 100 of this invention is the same or better than the variations of prior art reactor 10 and significantly better than the variations of reactor 10 using heat source 50' of FIG. 2B. The variation in thickness of the epitaxial layer between adjacent wafers in reactor 100 is of the same quality as prior art reactor 10. Hence, a larger heat source and a larger reactor chamber has been utilized within housing 15 of reactor 10 so that the batch size is increased by 100% for 200 mm wafers and yet the uniformity of epitaxial layers grown in the new reactor is essentially indistinguishable from the uniformity of the original reactor. This result is in sharp contrast to previous means for increasing the batch capacity of original reactor 10.

To achieve this uniformity requires adjustment of the gas flows through reaction chamber 160 because reaction chamber 160 of this invention is larger than reaction chamber 60 of prior art reactor 10. For reactor 100 of this invention, which uses the same gas ring and controls as the prior art reactor 10, discussed above, uniform epitaxial layers are grown with typical jet settings on the grid of 3.1 and 3.1, a main hydrogen flow of 107 liters per minute and a rotational hydrogen flow of 72 liters per minute. The flow of the deposition gas, such as trichlorosilane, into reaction chamber 160 must be adjusted to achieve the desired growth rate and process specifications. This adjustment is equivalent to the adjustments required for the prior art reactors and is known to those skilled in the art.

In the embodiment of this invention described above, the length of the susceptor was increased to provide an increased batch capacity for the epitaxial reactor. The reaction chamber and the heat source were enlarged so as to maintain industry standards for uniformity of epitaxial layers. While in this embodiment the susceptor was increased by about four inches and the heat source by about four and one-half inches, in view of the above description, equivalent modifications to other barrel epitaxial reactors using the principles of this invention will be apparent to those skilled in the art. Accordingly, the above embodiments of the invention are descriptive only and are not intended to limit the scope of the invention.

I claim:

1. A barrel epitaxial reactor for processing wafers, comprising:
   a housing wherein said housing originally contained a first reaction chamber means having a wall of a first length, and first radiant energy source means having a first length;
   second reaction chamber means having a wall of a second length and including a susceptor having a flat zone greater than 12 inches in length and less than or equal to about 18 inches in length in a first direction wherein said second reaction chamber means is operatively mounted in said housing and said second wall length is greater than said first wall length; and
   second radiant energy heat source means, operatively mounted in said housing, for providing heat energy over said flat zone so that epitaxial layers formed on adjacent wafers in a batch of wafers of the same diameter in said reaction chamber have a resistivity that varies by less than approximately ±10%, wherein said second radiant energy heat source means has a second length that is greater than said first radiant energy heat means length.

2. The barrel epitaxial reactor as in claim 1 wherein said second reaction chamber means wall comprises a transparent quartz wall.

3. The barrel epitaxial reactor as in claim 1 wherein said second radiant energy heat source means comprises a column of lamps having a first end and a second end wherein the energy output of each lamp varies in proportion to the voltage across the lamp.

4. The barrel epitaxial reactor of claim 3 wherein a plurality of lamps at said first end and a plurality of lamps at said second end of said column have a higher applied voltage than the applied voltage on other lamps in said column so that each lamp in said first and second pluralities has a higher energy output than the energy output of each of said other lamps.

5. The barrel epitaxial reactor of claim 4 wherein said higher applied voltage on said pluralities of lamps at said first and second ends of said column is in the range of about 25%–50% greater than the applied voltage of said other lamps.

6. The barrel epitaxial reactor of claim 1 further comprising forced air cooling means for maintaining an exterior surface of said wall of said second reaction chamber means at about a uniform temperature.

7. The barrel epitaxial reactor of claim 6 wherein said forced air cooling means comprises;
   blower means for providing forced air flow; and
   means, operatively coupled to said blower means, for distributing said forced air flow through said second radiant heat energy source means onto said wall of said second reaction chamber.

8. The barrel epitaxial reactor of claim 7, said forced air cooling means further comprising:
   means, operatively coupled to said distributing means, for diverting a portion of said forced air flow to a section of said wall beyond an end of said second radiant energy heat source means so that forced air flow is established along said wall of said second reaction chamber means.

9. The barrel epitaxial reactor of claim 8, said forced air cooling means further comprising:
   means for exhausting said forced air flow to a heat exchanger after said forced air flow has passed over said exterior surface of said wall of said second reaction chamber means.

10. A package for increasing the batch size of a barrel epitaxial reactor while maintaining the thickness and uniformity performance of the barrel epitaxial reactor, the barrel epitaxial reactor having (i) a housing containing a first radiant energy heat source of a first length, and a first reaction chamber with a flat zone of a first length and a wall of a first length, (ii) a voltage controller for said first heat source, (iii) means for providing gas flow, and (iv) cooling means, said package comprising:
    a second radiant energy heat source, operatively mountable in said housing, for replacing said first radiant energy heat source, wherein said second radiant energy heat source has (i) a radiant energy output in the range of 10–40% greater than the radiant energy output of said first heat source and (ii) a second length greater than said first radiant energy heat source length; and
    a second reaction chamber, operatively mountable in said housing, having (i) a flat zone with a length in the range of 25–50% greater than said first flat zone length, and (ii) a wall of a second length greater than said first reaction chamber wall length wherein said second radiant energy heat source and said second reaction chamber are operatively connectable with said voltage controller, said means for providing gas flow, and said cooling means thereby increasing the batch size of the barrel epitaxial reactor.

11. A package as in claim 10 wherein said cooling means for said barrel epitaxial reactor includes blower means for providing forced air flow, said package further comprising:
    means, operatively coupled to said blower means, for distributing said forced air flow through said second radiant energy heat source onto said wall of said second reaction chamber.

12. A package as in claim 11 further comprising:
    means, operatively coupled to said distributing means, for diverting a portion of said forced air flow to a section of said wall beyond an end of said heat source so that forced air flow is established along said wall of said second reaction chamber.

13. A package as in claim 11 further comprising:
    means for exhausting said forced air flow to a heat exchanger after said forced air flow has passed over said side wall of said second reaction chamber.

14. A package as in claim 10, said second radiant energy heat source having an approximately uniform average radiant energy output over said length of said flat zone of said second reaction chamber.

15. A package as in claim 14 wherein said second radiant energy heat source length is approximately 25% greater than said length of said flat zone of said second reaction chamber.

16. A package as in claim 15, said second radiant energy heat source having an average energy output in regions of said second radiant energy heat source extending beyond said flat zone of said second reaction chamber of about 25–50% greater than said average energy output of said second radiant energy heat source over said length of said flat zone of said second reaction chamber.

17. A method for improving the batch size of a barrel epitaxial reactor while maintaining the thickness and uniformity performance of the barrel epitaxial reactor, the barrel epitaxial reactor having a housing containing a first radiant energy heat source of a first length and a first number of lamps, a voltage controller for said first heat source, a first reaction chamber with (i) a flat zone of a first length and (ii) a wall of a first length, means for providing gas flow, and cooling means, said method comprising:

replacing said first radiant energy heat source with a second radiant energy heat source, said second radiant energy heat source having (i) a radiant energy output in the range of 10–40% greater than the radiant energy output of said first heat source (ii) a second length greater than said first radiant energy source heat length; and (iii) a second number of lamps wherein said second number of lamps is greater than said first number of lamps; and replacing said first reactor chamber with a second reaction chamber having (i) a flat zone with a length in the range of 25–50% greater than said first flat zone length and (ii) a second wall length greater than said first wall length, wherein said second radiant energy heat source and said second reaction chamber are (i) operatively mountable in said housing and (ii) operatively connectable with said voltage controller, said means for providing gas flow, and said cooling means.

18. A method as in claim 17 wherein said cooling means for said barrel epitaxial reactor includes a blower means for providing forced air flow, said method further comprising:

distributing said forced air flow through said second radiant energy heat source onto said wall of said second reaction chamber.

19. A method as in claim 18 further comprising:

diverting a portion of said forced air flow to a section of said wall of said second reaction chamber beyond an end of said second radiant energy heat source so that forced air flow is established along said wall of said second reaction chamber.

20. A method as in claim 18 further comprising: exhausting said forced air flow to a heat exchanger after said forced air flow has passed over said side wall of said second reaction chamber.

21. A method as in claim 18, said second radiant energy heat source having an approximately uniform average radiant energy output over said length of said flat zone of said second reaction chamber.

22. A method as in claim wherein said second radiant energy heat source length is approximately 25% greater than said flat zone of said second reaction chamber.

23. A method as in claim 22, said second energy heat source having an average energy output in regions of said second energy heat source extending beyond said flat zone of said second reaction chamber of about 25–50% greater than said average energy output of said second energy heat source over said length of said flat zone of said second reactor chamber.

* * * * *